(12) United States Patent
Dao

(10) Patent No.: US 7,530,037 B2
(45) Date of Patent: May 5, 2009

(54) METHODS OF GENERATING PLANAR DOUBLE GATE TRANSISTOR SHAPES AND DATA PROCESSING SYSTEM READABLE MEDIA TO PERFORM THE METHODS

(75) Inventor: Thuy B. Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 638 days.

(21) Appl. No.: 11/258,777

(22) Filed: Oct. 26, 2005

(65) Prior Publication Data

US 2007/0093029 A1    Apr. 26, 2007

(51) Int. Cl.
*G06F 17/50* (2006.01)
*H01L 21/336* (2006.01)

(52) U.S. Cl. .................. 716/11; 716/3; 716/5; 438/283
(58) Field of Classification Search ............... 716/5, 716/11, 3; 438/283
See application file for complete search history.

(56) References Cited

U.S. PATENT DOCUMENTS

| 5,097,422 | A | 3/1992 | Corbin, II et al. | |
|---|---|---|---|---|
| 6,099,582 | A * | 8/2000 | Haruki | 716/11 |
| 6,339,002 | B1 | 1/2002 | Chan et al. | |
| 6,662,350 | B2 | 12/2003 | Fried et al. | |
| 6,940,096 | B2 * | 9/2005 | Ravi | 257/69 |
| 7,013,447 | B2 | 3/2006 | Mathew et al. | |
| 7,074,656 | B2 * | 7/2006 | Yeo et al. | 438/157 |
| 7,315,994 | B2 * | 1/2008 | Aller et al. | 716/5 |
| 2003/0145299 | A1 | 7/2003 | Fried et al. | |
| 2004/0161898 | A1 * | 8/2004 | Fried et al. | 438/283 |
| 2005/0285161 | A1 * | 12/2005 | Kang et al. | 257/288 |
| 2006/0017119 | A1 * | 1/2006 | Jin et al. | 257/401 |
| 2006/0064191 | A1 | 3/2006 | Naya et al. | |
| 2007/0083847 | A1 | 4/2007 | Mansfield et al. | |

OTHER PUBLICATIONS

Nowak, Edward, et al., "Turning Silicon on its Edge: Overcoming Silicon Scaling Barriers with Double-Gate and FinFET Technology," IEEE Circuits & Devices Magazine, Jan./Feb. 2004, pp. 20-31.
Soloman, P.M., et al., "Two Gates are Better than One: A Planar Self-Aligned Double-Gate MOSFET Technology to Achieve the Best On/Off Switching Ratios as Gate Lengths Shrink," IEEE Circuits & Devices Magazine, Jan. 2003, pp. 48-62.
U.S. Appl. No. 11/098,874, filed Apr. 5, 2005.
U.S. Appl. No. 10/971,657, filed Oct. 22, 2004.
U.S. Appl. No. 11/258,987, Office Action mailed May 21, 2008.

* cited by examiner

*Primary Examiner*—Jack Chiang
*Assistant Examiner*—Magid Y Dimyan

(57) ABSTRACT

A method of generating a layout of one or more planar double gate transistors can include generating a single gate transistor layout at least in part from one or more double gate transistor circuits, logic diagrams, or any combination thereof, and generating the planar double gate transistor layout at least in part from the single gate transistor layout. The method is highly flexible regarding the generation and adjusting of gate shapes and gate contact shapes to ensure the proper connection of the gates to voltage or signal lines, and when such generation, adjusting, or any combination thereof is performed. In one embodiment, a data processing system can include a program that has code in the form of instructions to carry out the method.

19 Claims, 11 Drawing Sheets

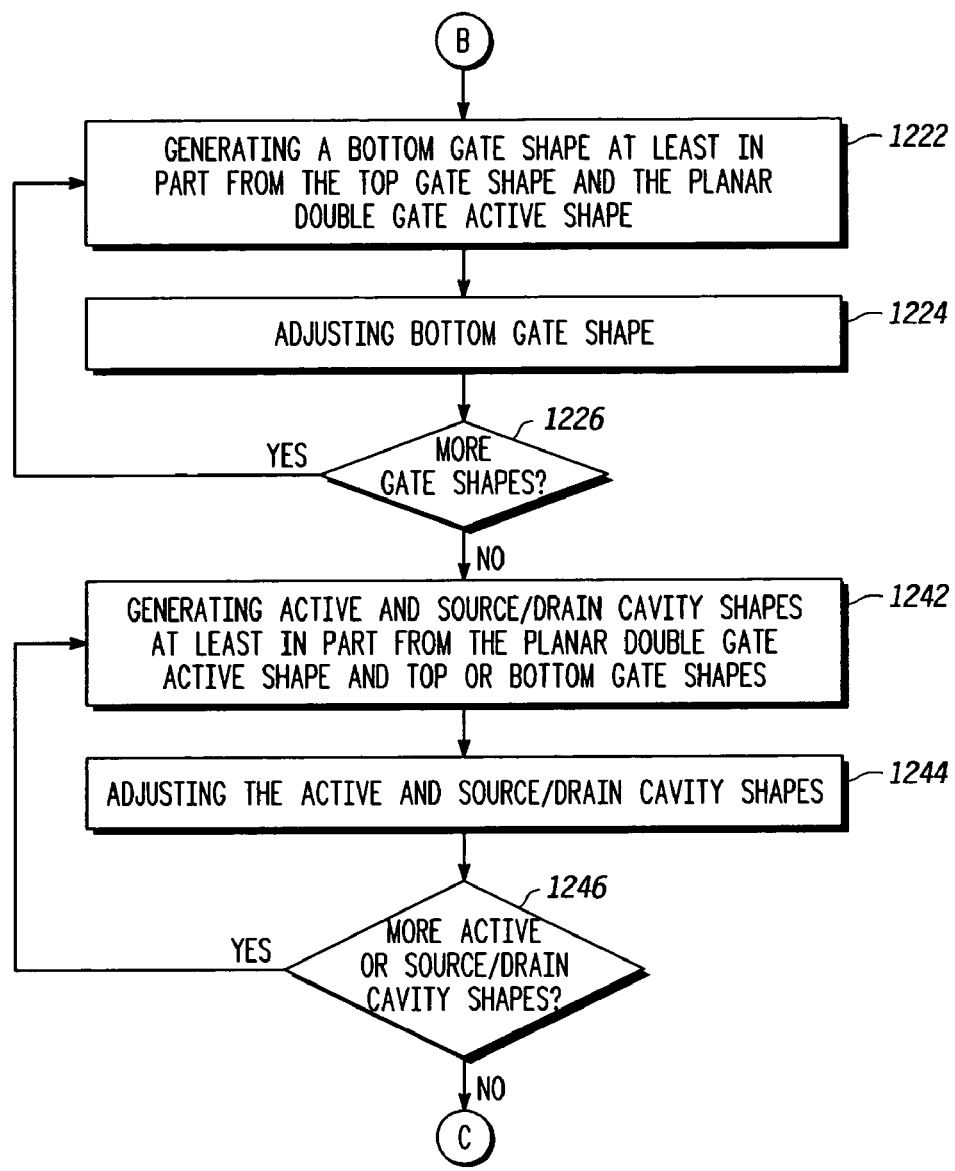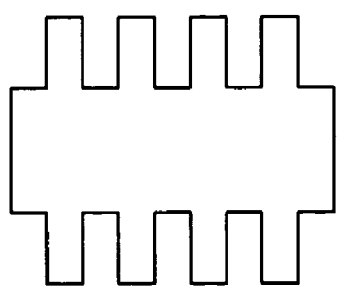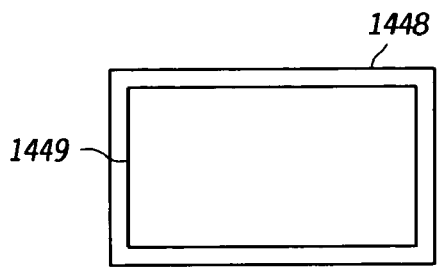
FIG. 12
FIG. 13
FIG. 14

METHODS OF GENERATING PLANAR DOUBLE GATE TRANSISTOR SHAPES AND DATA PROCESSING SYSTEM READABLE MEDIA TO PERFORM THE METHODS

RELATED APPLICATION

The present disclosure is related to U.S. patent application Ser. No. 11/258,987, entitled "Methods of Generating Planar Double Gate Transistor Shapes and Data Processing System Readable Media to Perform the Methods" by Dao filed concurrently herewith, assigned to the current assignee hereof, and is incorporated herein by reference in its entirety.

BACKGROUND

1. Field of the Disclosure

The present disclosure relates to methods of generating transistor shapes and data processing system readable media to perform the methods, and more particularly to methods of generating planar double gate transistor shapes and data processing system readable media to perform the methods.

2. Description of the Related Art

Conventional integrated circuits ("ICs") can include single or double gate transistors. Double gate transistors allow for better control of transistors and are currently being used more than they have in the past. Conventional software can generate a single gate transistor layout based on logic diagram or a circuit schematic. However, planar double gate transistors are typically manually generated. Many integrated circuits include a million, a billion or more transistors within a single integrated circuit. The process of manually generating the transistors or creating cell libraries to help design the double gate transistors can be costly and time consuming.

BRIEF DESCRIPTION OF THE DRAWINGS

Embodiments are illustrated by way of example and not limitation in the accompanying figures.

FIG. 12 includes a flow diagram for generating bottom gate shapes, active cavity shapes, and source/drain cavity shapes for the planar double gate transistor shapes.

FIG. 13 includes an illustration of a bottom gate shape generated at least in part from the top gate and planar double gate active shapes.

FIG. 14 includes an illustration of an active cavity shape and a source/drain cavity shape generated at least in part from the planar double gate active shape.

Figure 1:
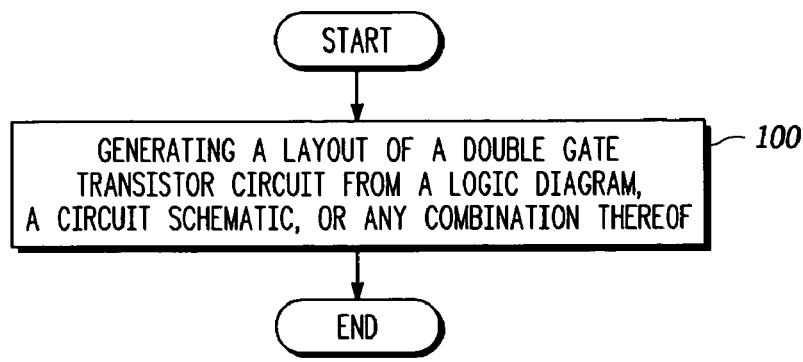
FIG. 1 includes a high-level flow diagram for a method of generating a layout of a planar double gate transistor circuit from a double gate transistor, circuit, logic diagram, or any combination thereof.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments.

DETAILED DESCRIPTION

A method of generating a layout of a planar double gate transistor circuit can include generating a single gate transistor shape at least in part from a double gate transistor circuit schematic, logic diagram, or any combination thereof. The method can also include generating the layout including a planar double gate transistor shape at least in part from the single gate transistor shape. Generating a single gate transistor shape may optionally include generating a circuit schematic including a single gate transistor at least in part from the double gate transistor circuit schematic, logic diagram, or any combination thereof before actually generating the single gate transistor shape. As used herein, "shape" refers to information regarding a subsequently formed physical feature within an electronic device that substantially corresponds to a designed feature within a layout.

The source of the information regarding the double gate transistor(s) is highly variable and may include a logic diagram, a circuit schematic, a network listing ("netlist"), other suitable representation, one or more non-planar double gate transistor shapes, or the like. In one embodiment, one or more single gate transistors may be generated at least in part from the double gate transistor(s). One or more gate contact indicators and related bottom gate signal information may be retained. The method is highly flexible regarding the generation and adjusting of gate shapes and gate contact shapes to ensure the proper connection of the gates to voltage or signal lines, and when such generation, adjusting, or any combination thereof is performed. In one embodiment, a data processing system can include a program that has code in the form of instructions to carry out the method.

The term "double gate transistor" is intended to mean a transistor that includes at least two different gate electrodes. In one embodiment, a double gate transistor has only two gate electrodes. In another embodiment, a double gate transistor has more than two gate electrodes.

The term "transistor shape" is intended to mean a collection of shapes that can be used to make a transistor structure. In one embodiment, a transistor shape can include an active shape, a gate shape, a gate contact shape, other suitable shape, or any combination thereof.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the terms "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Unless stated otherwise, components may be bi-directionally or uni-directionally coupled to each other. Coupling should be construed to include direct electrical connections and any one or more of intervening switches, resistors, capacitors, inductors, and the like between any two or more components.

Other features and advantages of the invention will be apparent from the following detailed description, and from the claims.

To the extent not described herein, many details regarding specific materials, processing acts, design, layout, and circuits are conventional and may be found in textbooks and other sources within the semiconductor, design, layout, circuits, and microelectronic arts.

A method can be used to automatically generate a planar double gate transistor layout from nearly any representation of a conventional electronic device (e.g., an integrated circuit), or portion thereof. FIG. 1 includes a high-level process flow diagram in accordance with an embodiment. The method can include generating a layout of a double gate transistor circuit from a double gate circuit schematic, logic diagram, or any combination thereof, as illustrated in block 100 of FIG. 1 and is described in more detail below. The method will now be described in more detail with respect to an exemplary, non-limiting embodiment to help in understanding the concepts described herein. While many details are described with respect to particular embodiment, those details do not limit the scope of the present invention.

Figure 2:
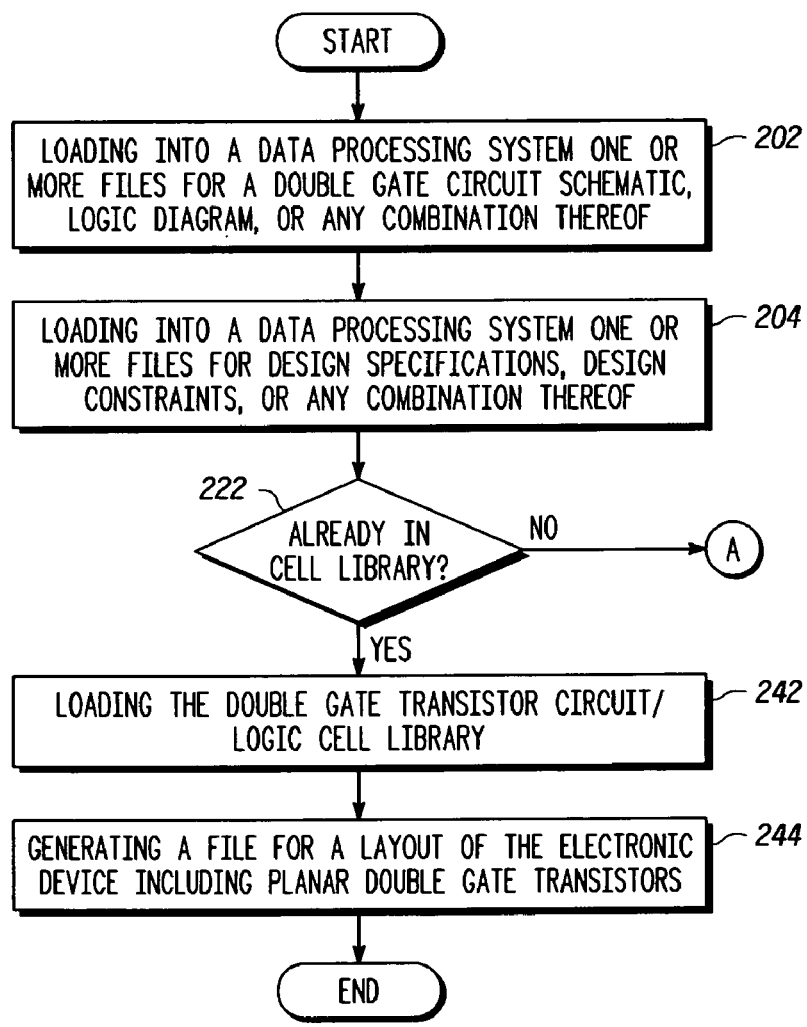
FIG. 2 includes a flow diagram for loading files into a data processing system and using a cell library, if applicable.

The method can include loading into a data processing system one or more files for a double gate transistor circuit, logic diagram, or any combination thereof (block 202 in FIG. 2). In one embodiment, the electronic device can include double gate transistors that may be in nearly any form of data processing system readable representation. A non-limiting example includes a logic diagram, a circuit schematic, a netlist, other suitable representation, or the like. In another example, an existing double gate layout for non-planar double gate transistor shapes (e.g., for FinFET transistors) can be used. Skilled artisans appreciate that a layout can be generated from logic diagram (e.g., AND, OR, and other similar logic connectors) without having to generate a circuit schematic. Therefore, for the purposes of this specification, a logic diagram can be considered as having one or more double gate transistors if that logic diagram can be achieved using one or more double gate transistors.

Figure 3:
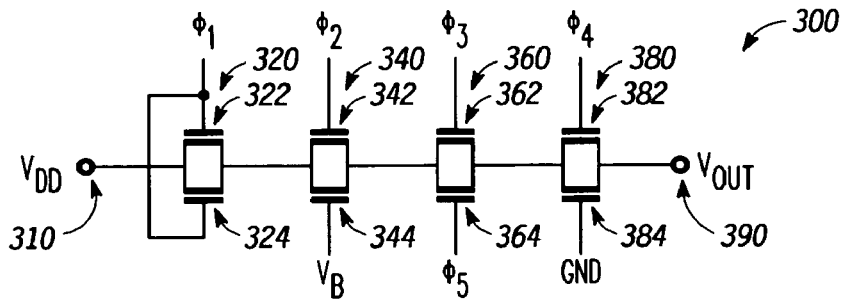
FIG. 3 includes a schematic diagram that includes a circuit with double gate transistors.

In a particular embodiment, a non-limiting exemplary input can include a schematic diagram of a circuit 300 that is a portion of the electronic device, as illustrated in FIG. 3. $V_{DD}$ terminal 310 provides $V_{DD}$ as an input signal and $V_{OUT}$ terminal 390 receives an output signal for the circuit 300. The circuit 300 includes four serially connected double gate transistors 320, 340, 360, and 380. The double gate transistor 320 includes a top gate 322 and a bottom gate 324 both connected to $\phi_1$. The double gate transistor 340 includes a top gate 342 connected to $\phi_2$ and a bottom gate 344 connected to $V_B$, which is similar to a well tie, substrate tie, or other signal that would be equivalent to a back bias used in a single gate transistor. The double gate transistor 360 includes a top gate 362 connected to $\phi_3$ and a bottom gate 364 connected to $\phi_5$. For double gate transistor 360, two different signals, which may or may not vary with time, can be used for the gate voltages. The double gate transistor 380 includes a top gate 382 connected to $\phi_4$ and a bottom gate 384 connected to ground ("GND"). The circuit schematic for circuit 300 can be in a form that can be read by a data processing system.

The method can also include loading into the data processing system one or more files for design specifications, design constraints, or any combination thereof (block 204). Such design specifications can include transistor channel length, transistor channel width, well ties, resistor values, capacitor values, one or more other physical or electrical specifications, or any combination thereof. The design constraints can include design rules or other limitations for the integrated circuit. For example, a design rule can include a minimum feature size, a minimum space between features, or other similar limitation.

A determination can be made whether there is a cell library with the double gate transistor circuit that can be used (diamond 222). If yes, the method can include loading the double gate circuit/logic cell library (block 242). The double gate circuit/logic cell library may include double gate circuit cells, logic cells, or any combination thereof. The cell library may have all the cells used in the circuit. Alternatively, a layout can be generated using one or more methods as described in more detail below and at least part of the information saved within the cell library. Returning to FIG. 2, the method can also include generating a file of a layout of the electronic device including planar double gate transistors (block 244). In one embodiment, the layout generation process can end at this point.

Figure 4:
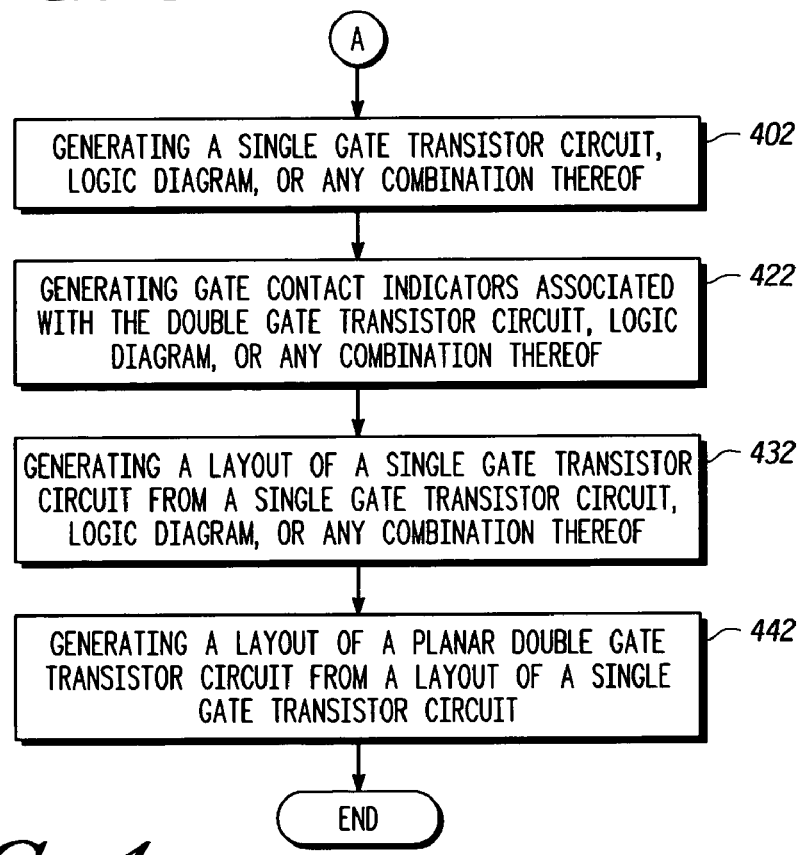
FIG. 4 includes a process of generating a corresponding single gate transistor circuit, gate contact indicators, and a layout of planar double gate transistor circuit from the single gate transistor circuit.
Figure 5:
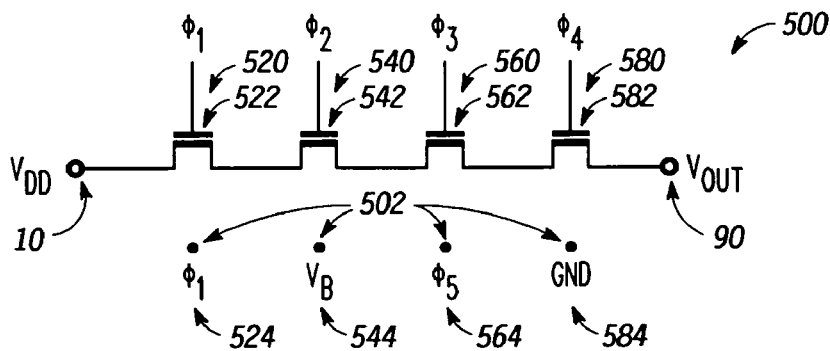
FIG. 5 includes a schematic diagram that includes the circuit of FIG. 3 after generating the single gate transistors and gate contact indicators.

If a cell library does not exist or does not have a cell corresponding to any one or more parts of the desired circuit, logic diagram, or both, the method continues as illustrated in FIG. 4. The method can further include generating a single gate transistor circuit, logic diagram, or any combination thereof (block 402) and generating gate contact indicators associated with the double gate transistor circuit, logic diagram, or any combination thereof (block 422). After reading this specification, skilled artisans will appreciate that the gate contacts are in reference to the bottom gates (as illustrated) or in reference to top gates (not illustrated) if the single transistor gates correspond to the bottom gates. In one embodiment, single gate transistors can be generated at least in part from double gate transistors, and second gate contact indicators associated with the single gate transistors can be generated. Referring to FIG. 5, circuit 500 includes single gate transistors 520, 540, 560, and 580 that are similar to the double gate transistors 320, 340, 360, and 380 in FIG. 3. Top gates 322, 342, 362, and 382 are replaced by gates 522, 542, 562, and 582, respectively. The bottom gates 324, 344, 364, and 384 are not illustrated in the circuit schematic; however, the information related to the bottom gates 324, 344, 364, and 384 is retained using gate contact indicators 502 and signal information. For example, in FIG. 5, each of the transistors 520, 540, 560, and 580 includes a second gate contact indicator signal 502, such as a flag or other suitably defined variable, and the voltage or signal information associated with the bottom gates 324, 344, 364, or 384 is retained as bottom gate signal data 524 having a value corresponding to $\phi_1$, 544 having a value corresponding to $V_B$, bottom gate signal data 564 having a value corresponding to $\phi_5$, and bottom gate signal data 584 having a value corresponding to GND, respectively.

In another embodiment, a second gate contact indicator 502 can be used to indicate that separate electrical connections will be used for the top and bottom gates for double gate transistors 340, 360, and 380. In this embodiment, the gate signal indicator for the transistor 520 may be in an opposite state as compared transistors 540, 560, and 580, and the value 524 may or may not be retained since its value is the same as the value for gate 522. In another embodiment, the logic could be reversed, such that a second gate contact indicator (not illustrated) can be used to indicate that the top and bottom gates will be electrically connected to each other, such as with double gate transistor 320.

At this point in the process, a corresponding single gate transistor circuit and appropriate gate contact information and voltage or signal information for bottom gates have been generated at least in part from the double gate transistor circuit schematic, logic diagram, or any combination thereof.

The method can also include generating a layout of a single gate transistor circuit from the single gate transistor circuit, logic diagram or any combination thereof in block 432. The layout of the single gate transistor circuit can be performed using a conventional or proprietary technique. In one particular embodiment, the layout of the single gate transistor circuit can be performed using a commercially available software program. The method can further include generating a layout of a planar double gate transistor circuit from a layout of a single gate transistor circuit, as illustrated in block 442 of FIG. 4. A non-limiting technique for performing the action in block 442 is described with respect to FIG. 6.

Figure 6:
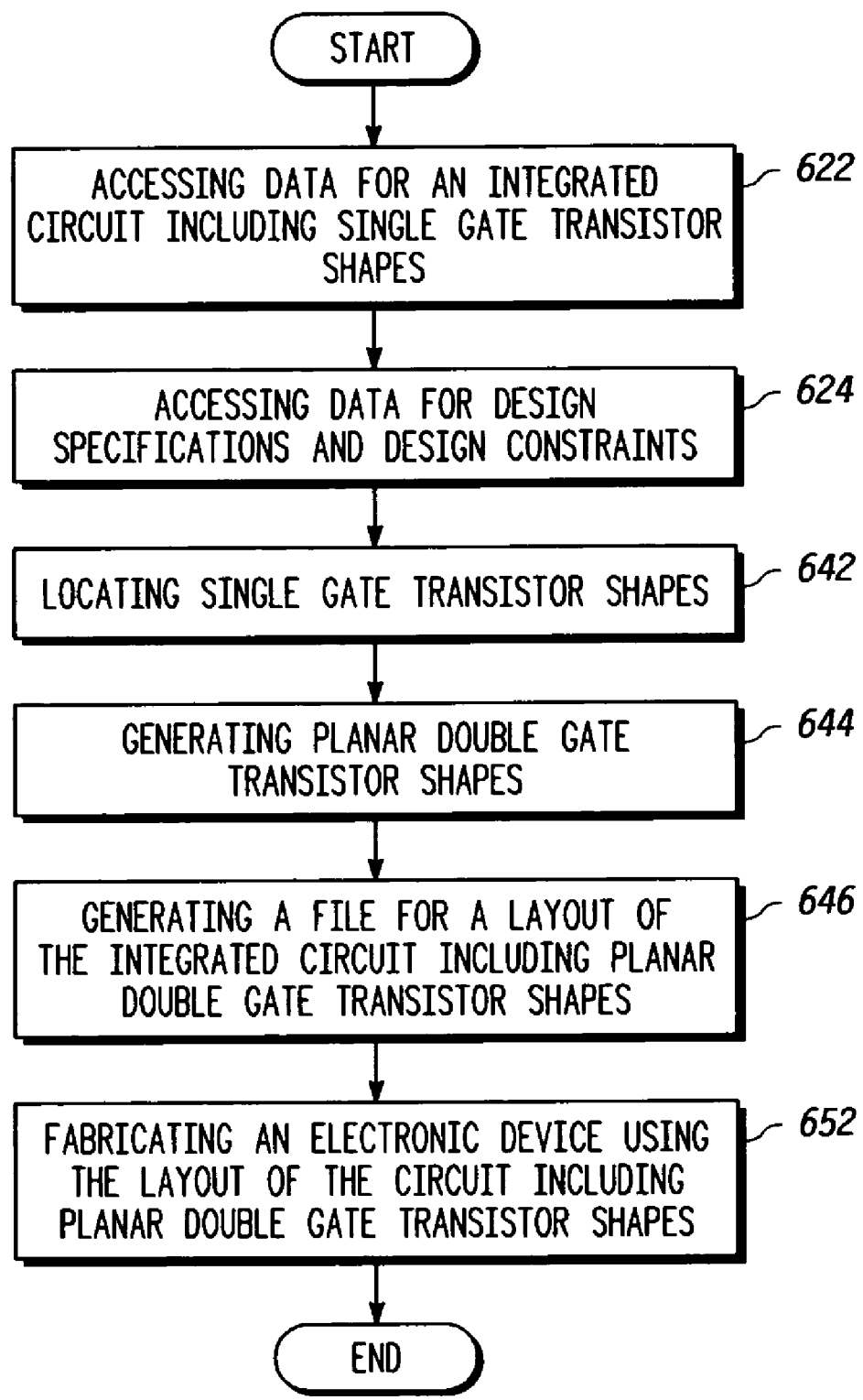
FIG. 6 includes a more detailed flow diagram for a method of generating planar double gate transistor shapes from single gate transistors shapes and fabricating an electronic device using the planar double gate transistor shapes.

Referring to FIG. 6, the method can include accessing data for an integrated circuit including single gate transistor shapes (block 622). As used herein, "accessing" should be interpreted broadly and be construed to include loading, reading, or otherwise obtaining data. For example, one or more files including the data may be retrieved from a database, the data may currently be in random-access memory ("RAM") (e.g., data was previously written into RAM for a related or unrelated reason), or the like. In one embodiment, the single gate transistor and its corresponding data may be found in any one or more of the layers used in forming the single gate transistor. Such layers can include a gate layout layer, and active layout layer, an implantation layout layer, a contact layout layer, a via layer layout, an interconnect layer layout, a well layer layout, a passivation layer layout, one or more other layout layers, or any combination thereof. The method can also include accessing data for design specifications and design constraints (block 624). Such design specifications can include transistor channel length, transistor channel width, well ties, resistor values, capacitor values, one or more other physical or electrical specifications, or any combination thereof. The design constraints can include design rules or other limitations for the integrated circuit. For example, a design rule can include a minimum feature size, a minimum space between features, or other similar limitation. The method can further include locating single gate transistor shapes (block 642), as described with respect to FIGS. 7 and 8, and generating planar double gate transistor shapes (block 644), as described with respect to FIGS. 9 through 19. The method can also include generating a data processing file, which can be used within a data processing system, for a layout of the integrated circuit including planar double gate transistor shapes (block 646). The method can further include fabricating an electronic device using the layout of the integrated circuit including planar double gate transistor shapes (block 652). For example, a set of lithographic masks can be generated using the layout information, and the set of lithographic masks can be used at different levels to define planar double active regions, top gate electrodes, bottom gate electrodes, define contact openings, etc.

Figure 7:
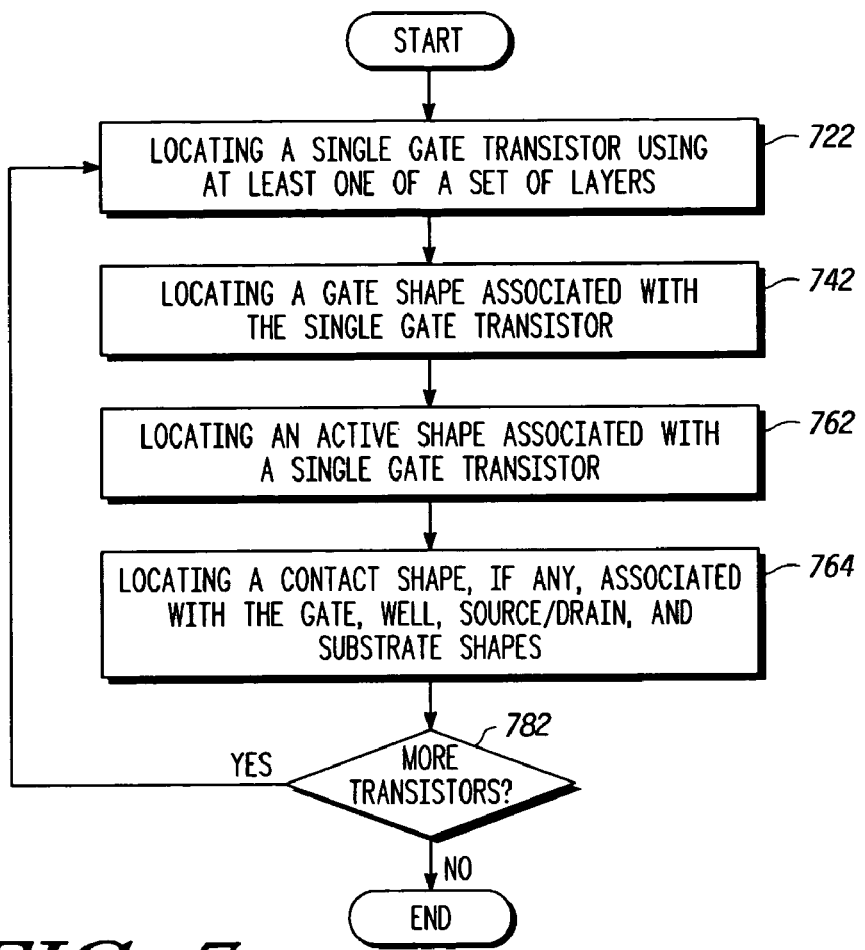
FIG. 7 includes a flow diagram for locating single gate transistor shapes.
Figure 8:
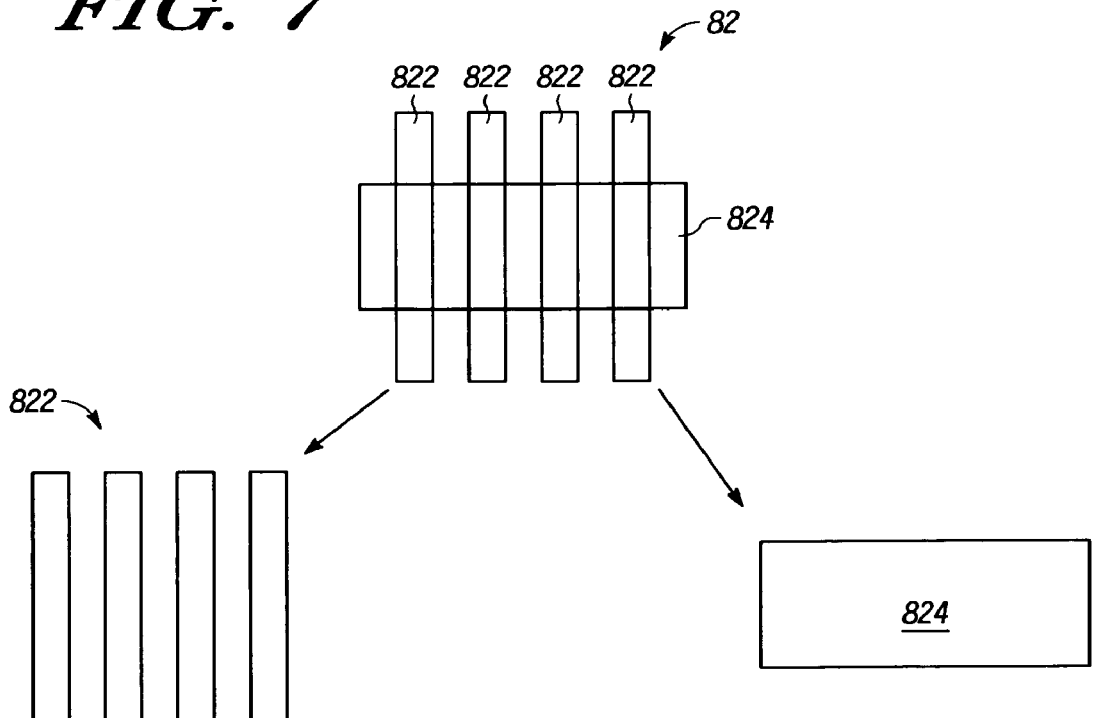
FIG. 8 includes an illustration of gate shapes and an active shape that can be located from a single gate transistor shape.

A portion of the method related to locating single gate transistor shapes is described more specifically with respect to FIGS. 7 and 8. The method can include locating a single gate transistor using at least one of a set of layers (block 722 in FIG. 7). Such layers have been previously described. A gate layout layer, by itself, may not be enough to locate single gate transistors. For example, a shape within the gate layout layer may correspond to a resistor or a capacitor electrode. The manner for locating the single gate transistor can be highly variable depending on the specific methodology chosen. For example, transistors may be located by tracing a signal from a bond pad corresponding to the passivation layout layer, through one or more interconnect layout layers, one or more via layout layers, one or more contact layout layers, an active layout layer, or any combination thereof. In one embodiment, the single gate transistors may be located by searching for any shape within the gate layout layer that extends completely across a dimension of the active layout layer.

After a single gate transistor has been located, the method can include locating a gate shape associated with the single gate transistor (block 742). As the gate shape is found, it can be stored in memory. The method can also include locating an active shape associated with the single gate transistor (block 762). As the active shape is located, it can be stored in memory, too. The method can further include locating a contact shape, if any, associated with any one or more of the gate, well, S/D, and substrate shapes (block 764). The contact shape may be relevant in determining whether the single gate transistor lies within a well region that is biased at a potential other than the substrate or other portion of the integrated circuit. The significant of such contact shape will be described later with respect to contact shapes associated with gate shapes for the planar double gate transistors. A determination can be made whether there is another single gate transistor (diamond 782) in the layout of the integrated circuit. If "yes," the method is iterated until all single gate transistors have been located in the layout of the integrated circuit. If there are no more single gate transistors, the method for locating single gate transistor shapes is complete.

FIG. 8 includes an illustration of some single gate transistor shapes within the integrated circuit 12. From the information obtained, gate shapes 822 and an active shape 824 have been found. Other gate shapes and other active shapes are also found using the same method. The illustration in FIG. 8 is a non-limiting exemplary embodiment.

Figure 9:
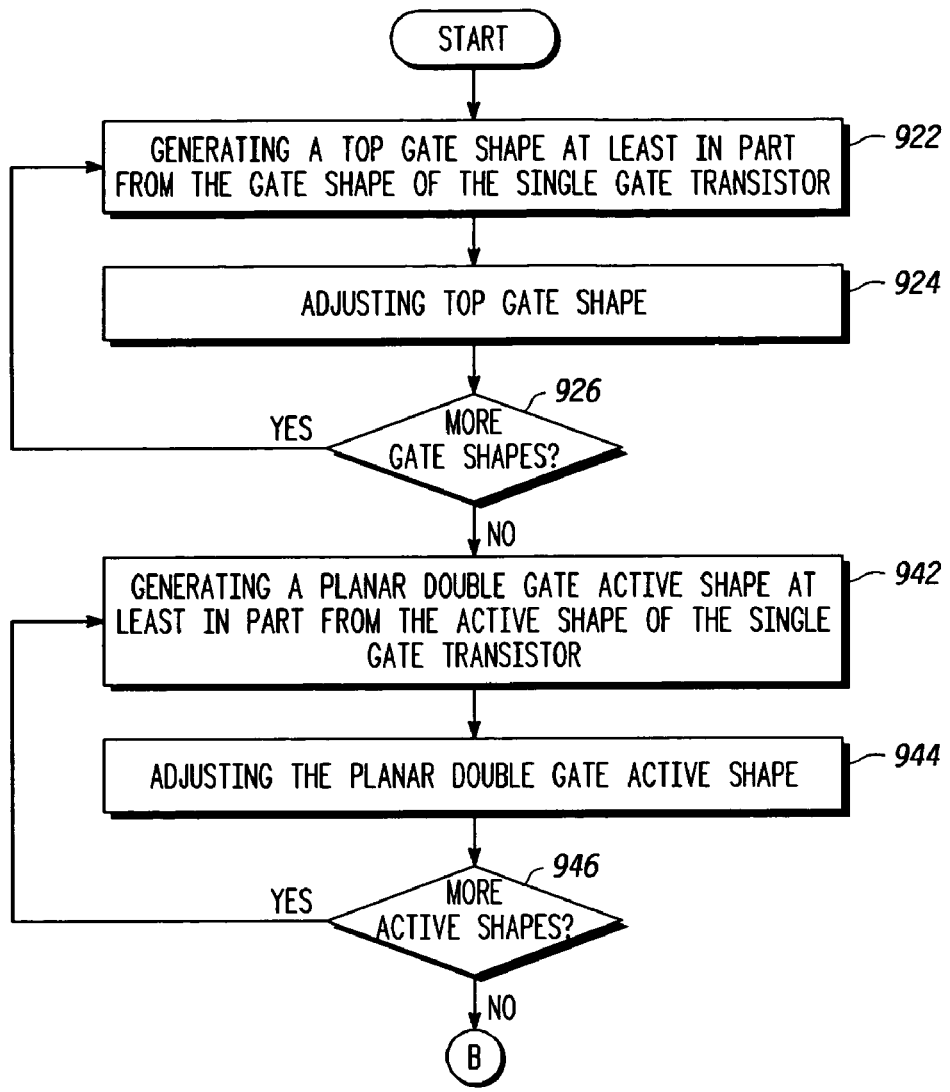
FIG. 9 includes a flow diagram for generating top gate shapes and planar double gate active shapes for the planar double gate transistor shapes.

The planar double gate transistor shapes can now be generated as described herein. Referring to FIG. 9, the method can include generating a top gate shape at least in part from the gate shape of the single gate transistor (block 922) and adjusting the top gate shape (block 924).

Adjusting, when referring to this figure and other subsequent figures, can include re-sizing, shifting, re-locating, moving, copying, rotating, flipping, duplicating, biasing (e.g., sizing differentials), combining, shrinking, subtracting, adding, overlapping, under-lapping, overlaying, performing an inclusive-OR operation, performing an AND operation, performing an exclusive-OR operation, performing a NOT operation, performing Boolean algebraic operation, performing an exclusion operation, cutting, pasting, grouping, ungrouping, performing one or more operations from a script or other programming, performing a computer-aided design ("CAD") operation, or any combination thereof. The adjustments may be performed in order to better meet one or more of the design specifications, one or more of the design constraints, or any combination thereof.

In another embodiment, information related to well ties or other device information (e.g., whether the transistor is an n-channel, a p-channel, an enhancement mode, a depletion mode, or other similar information) may be used in adjusting the top gate shape. Such information may be relevant in later determining whether gate contacts will be made separately to the top and bottom gates for a transistor or if such top and bottom gates of a planar double gate transistor are to be electrically connected to each other. Such adjustments for gate contacts can be performed later in the method if desired. In another embodiment, another adjustment for the top gate shape may include adding a resistor portion, a capacitor electrode portion, or other electronic component portion.

Figure 10:
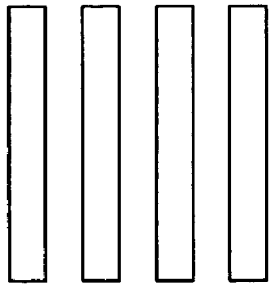
FIG. 10 includes an illustration of top gate shapes of planar double gate transistors generated at least in part from the gate shapes of single gate transistors.

A determination can be made whether there is another top gate shape to be generated (diamond 926). If "yes," the method is iterated until all top gate shapes have been generated. If there are no more top gate shapes, the top gate shapes can be stored in memory. FIG. 10 includes an illustration of top gate shapes 1042 that are generated at least in part from the gate shapes 822.

The method can include generating a planar double gate active shape at least in part from the active shape of the single gate transistor (block 942 in FIG. 9) and adjusting the planar double gate active shape (block 944) using any one or more of the adjusting operations previously described. The adjustments may be performed in order to better meet one or more of the design specifications, one or more of the design constraints, or any combination thereof. In another embodiment, another adjustment for the double transistor active shape may include adding a resistor portion, a capacitor electrode portion, or other electronic component portion.

Figure 11:
FIG. 11 includes an illustration of a planar double gate active shape generated at least in part from the active shape of single gate transistors.

A determination can be made whether there is another planar double gate active shape to be generated (diamond 946). If "yes," the method is iterated until all planar double gate active shapes have been generated. If there are no more planar double gate active shapes, the planar double gate active shapes can be stored in memory. FIG. 11 includes an illustration of a planar double gate active shape 1144 that is generated at least in part from the active shape 824.

Referring to FIG. 12, the method can include generating a bottom gate shape at least in part from the top gate shapes and the planar double gate active shape (block 1222). In one particular embodiment, an inclusive-OR operation can be performed such that the initial bottom gate shape corresponds to any combination of the top gate shapes and the planar double gate active shapes. The method can also include adjusting the bottom gate shape (block 1224) using any one or more of the adjusting operations previously described. The adjustments may be performed in order to better meet one or more of the design specifications, one or more of the design constraints, or any combination thereof. In a particular embodiment, the portion of the bottom gate shape that is associated with the planar double gate active shape can be increased in the length, the width, or both to allow for potential misalignment between the bottom gate layout layer and the planar double gate active layer when forming integrated circuits.

In another embodiment, information related to well ties or other device information (e.g., whether the transistor is an n-channel, a p-channel, an enhancement mode, a depletion mode, or other similar information) may be used in adjusting the bottom gate shape. Such information may be relevant in later determining whether gate contacts will be made separately to the top and bottom gates for a transistor or if such top and bottom gates are to be electrically connected to each other. Such adjustments for gate contacts can be performed later in the method if desired. In another embodiment, another adjustment for the bottom gate shape may include adding a resistor portion, a capacitor electrode portion, or other electronic component portion.

A determination can be made whether there is another bottom gate shape to be generated (diamond 1226). If "yes," the method is iterated until all bottom gate shapes have been generated. If there are no more bottom gate shapes, the bottom gate shapes can be stored in memory. FIG. 13 includes an illustration of a bottom gate shape 1346 that is generated at least in part from the top gate shapes 1042 (FIG. 10) and the planar double gate active shape 1144.

The method can include generating active cavity and S/D cavity shapes at least in part from the planar double gate active shape and top or bottom gate shapes (block 1242 in FIG. 12) and adjusting the active cavity and S/D cavity shapes (block 1244) using any one or more of the adjusting operations previously described. The adjustments may be performed in order to better meet one or more of the design specifications, one or more of the design constraints, or any combination thereof. In another embodiment, the active cavity shape can be generated at least in part from the planar double gate active portion of the bottom gate shape 1346 (FIG. 13) in addition to or in place of the planar double gate active shape. In one particular embodiment, the active cavity shape can be increased in the length, the width, or both, as compared to the portion of the bottom gate shape that is associated with the planar double gate active shape, to allow for potential misalignment between the active cavity layout layer and the bottom gate layout layer when forming integrated circuits. In still another particular embodiment, the portion of the bottom gate shape that is associated with the planar double gate active shape may be one minimum feature size larger than the planar double gate active shape along each side, and the active cavity shape may be one minimum feature size larger than the portion of the bottom gate shape that is associated with the planar double gate active shape. Therefore, in this particular embodiment, $A_{dgas} = L \times W;$ $A_{bgdgas} = (L+2f) \times (W+2f);$ and $A_{acs} = (L+4f) \times (W+4f),$ wherein:

$A_{dgas}$ is the area of the planar double gate active shape;
L is the length of the planar double gate active shape;
W is the width of the planar double gate active shape;
$A_{bgdgas}$ is the area of the portion of the bottom gate shape that is associated with the planar double gate active shape;
f is the minimum feature size; and
$A_{acs}$ is the area of the active cavity shape.

Portions of the top gate shapes 1042 (FIG. 10) and bottom gate shape 1346 (FIG. 13) extend beyond the edges of the active cavity shape 1448 (FIG. 14), as seen from a top view, when the layout layers are aligned with respect to one another. The S/D cavity shape 1449 may be derived from the active cavity shape 1448. For example, the S/D cavity shape 1449 can be slightly narrower and shorter than the active cavity shape 1448. Although FIG. 14 includes an illustration with two shapes, each of the shapes can be used in different masks that are used at different times in the fabrication process.

A determination can be made whether there is another active cavity or S/D cavity shape to be generated (diamond 1246). If "yes," the method is iterated until all active cavity and S/D cavity shapes have been generated. If there are no more active cavity or S/D cavity shapes, the active cavity and S/D cavity shapes can be stored in memory. FIG. 14 includes an illustration of an active cavity shape 1448 and S/D cavity shape 1449 that is generated at least in part from the planar double gate active shape 1144 (FIG. 11).

Figure 15:
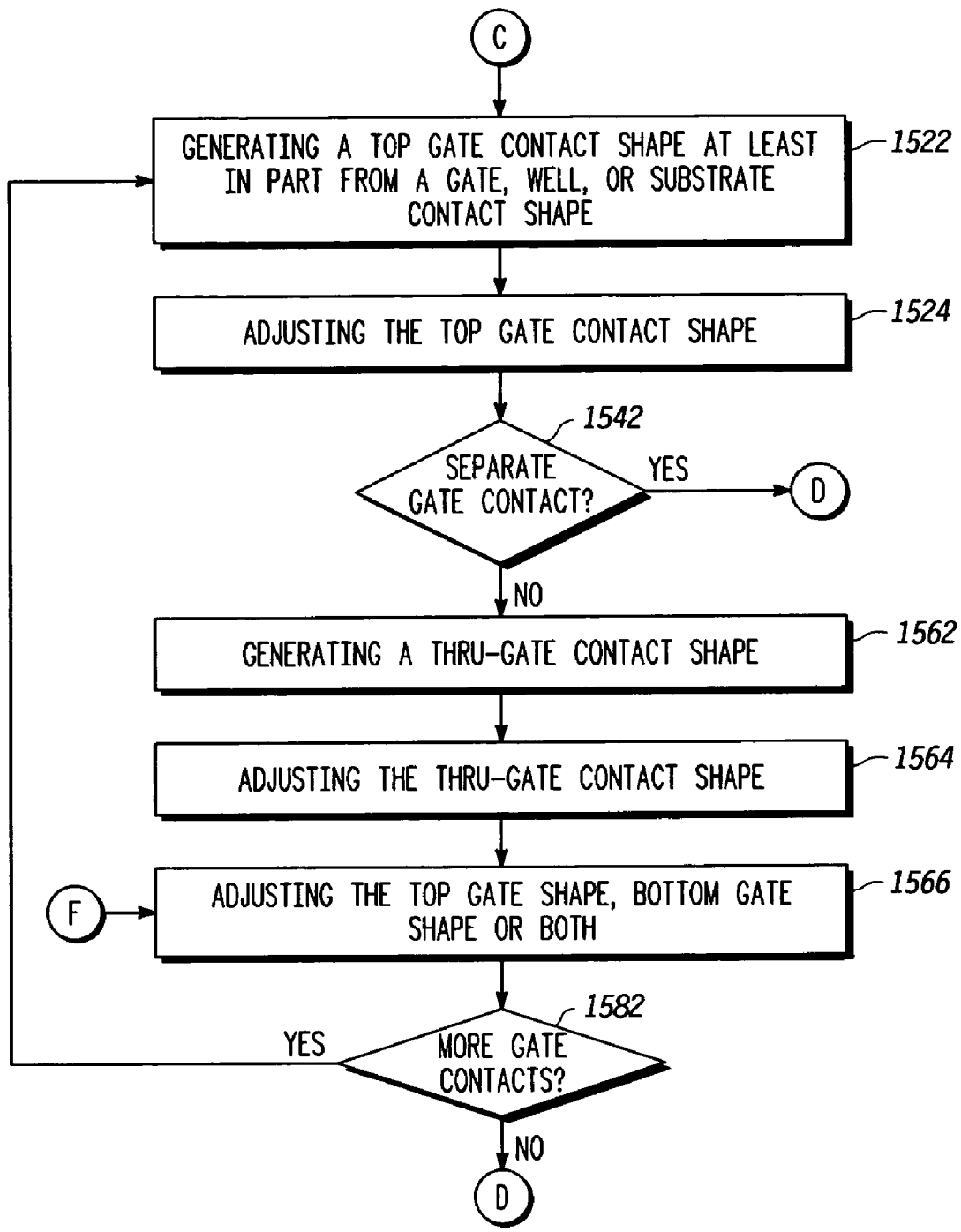
FIGS. 15 and 16 include a flow diagram for generating top gate contact shapes, determining whether top and bottom gates are separate, generating thru-gate contact shapes and bottom gate contact shapes for the planar double gate transistor shapes.

Referring to FIG. 15, the method can include generating a top gate contact shape at least in part from a gate, well, or substrate contact shape of the single transistor layout (block 1522). Each of the top gate contact shapes has a corresponding top gate shape 1042 (FIG. 10) that will allow a conductor (e.g., any combination of a contact plug and a metal-containing interconnect) to be electrically connected to the top gate. The top gate contact shape will be located over the one of the top gate shape 1042 at a location outside of the active cavity shape 1448 (FIG. 14).

The method can also include adjusting the top gate contact shape (block 1524) using any one or more of the adjusting operations previously described. The adjustments may be performed in order to better meet one or more of the design specifications, one or more of the design constraints, or any combination thereof.

Other contact shapes (not illustrated) to the top gate shapes can be added at this time. Such other contact shapes can include contact shapes to resistors, capacitor electrodes, other electronic components, or any combination thereof formed within the top gate layout layer.

A determination can be made whether there are separate gate contacts for each planar double gate transistor (diamond 1542). The top and bottom gates for a planar double gate transistor are connected to each other or are connected to different signal lines. For example, the conventional single gate transistor design may have a single gate transistor with its channel region within a well that is biased differently from another single gate transistor with its channel region within the substrate, but outside the well, where the well and substrate are placed at different potentials during operation. In this embodiment, the single gate transistor with its channel within the well region may have separate top and bottom gate contacts for its corresponding planar double gate transistor to allow for the manipulation of the bottom gate because the well contacts from the single gate transistor layer are no longer required, whereas for the other single gate transistor, the top and bottom gates for its corresponding planar double gate transistor may be electrically connected to each other.

In still another embodiment, the determination of whether the top and bottom gates are electrically connected or separate can depend on whether the transistors being formed are to be partially or fully depleted, the work functions of the top or bottom gate, or for having body biasing effect of single gate transistor in low-power mode, or other electronic considerations. After reading this specification, skilled artisans will appreciate that there may be a wide variety of situations where the top and bottom gates should or should not be electrically connected to each other through direct thru-gate contact or separate gate contact for separate bottom gate biasing control.

If "no," the method can include generating a thru-gate contact shape at least in part from a top gate contact shape (block 1562). The thru-gate contact will extend through the top gate and land on the bottom gate. The method can also include adjusting the thru-gate contact shape (block 1564) using any one or more of the adjusting operations previously described.

The adjustments may be performed in order to better meet one or more of the design specifications, one or more of the design constraints, or any combination thereof. The method can further include adjusting the top gate shape, bottom gate shape, or both (block 1566). Such adjustment(s) may be made to ensure that the bottom gate contact shape can fully enclose the bottom gate contact, or it does not contact the top gate shape from a top view, and allow for potential misalignment between the top gate layout layer and the bottom gate contact layout layer.

A determination can be made whether there is another gate contact shape to be examined (diamond 1582). If "yes," the method is iterated until all gate contact shapes have been examined. If there are no more gate contact shapes to be examined, the gate contact shapes can be stored in memory.

Figure 16:
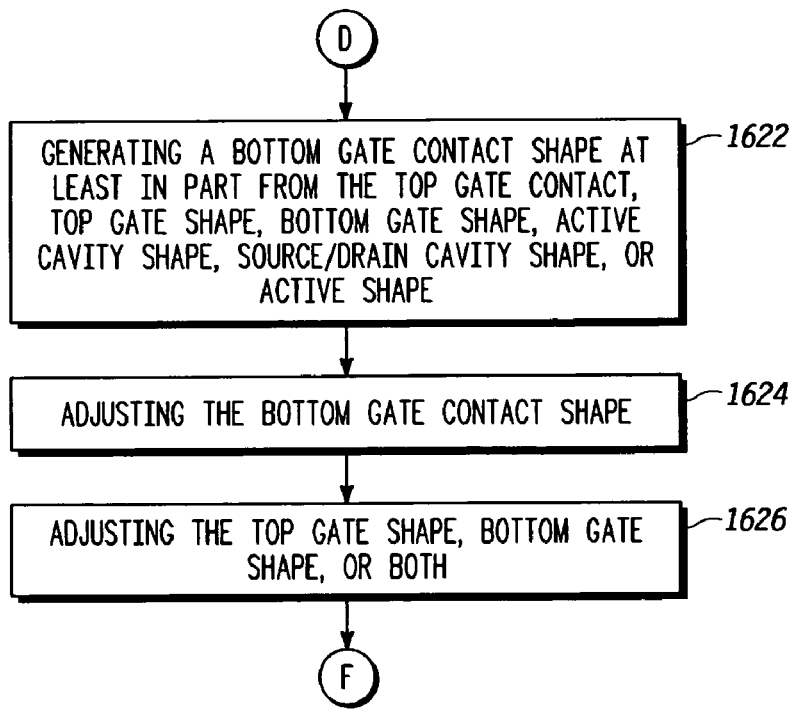

If the top and bottom gates for a planar double gate transistor have separate contacts ("yes" branch from diamond 1542), the method can include generating a bottom gate contact shape at least in part from the top gate contact, top gate shape, bottom gate shape, active cavity shape, S/D cavity shape, or active shape (block 1622 in FIG. 16). In another embodiment, less than all of the shapes as recited in block 1622 may be used in generating the bottom gate contact shapes. The bottom gate contact will land on the bottom gate but will not overlap with the top gate. The method can also include adjusting the bottom gate contact shape (block 1624) using any one or more of the adjusting operations previously described. The adjustments may be performed in order to avoid electrical short between top and bottom gate, better meet one or more of the design specifications, one or more of the design constraints, or any combination thereof. Returning to FIG. 15, the method can also include adjusting the top gate shape, the bottom gate shape, or both (block 1566). The method as described herein is flexible in that the adjustments to shapes can be performed at nearly any time.

Other contact shapes (not illustrated) to the bottom gate shapes can be added at this time. Such other contact shapes can include contact shapes to resistors, capacitor electrodes, other electronic components, or any combination thereof.

Figure 17:
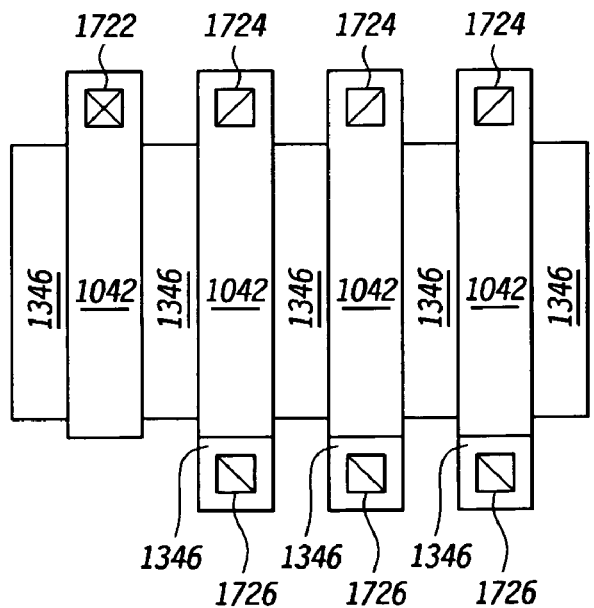
FIG. 17 includes an illustration of gate contact shapes, such as top gate contact, bottom gate contact, and thru-gate contact shapes, in relationship to top and bottom gate shapes.

FIG. 17 includes an illustration of a thru-gate contact shape 1722, top gate contact shapes 1724, and bottom gate contact shapes 1726 to demonstrate positional relationships between the gate contact shapes and their underlying top gate shapes 1042 and bottom gate shapes 1346, respectively.

In one embodiment, one or more of the lengths or widths of the top gate shapes 1042 can be adjusted to expose portions of the underlying bottom gate shape 1346 to allow for separate gate contacts for the affected planar double gate transistors. In another embodiment, one or more portions of the bottom gate shapes 1346 can be adjusted. The thru-gate contact shape 1722 will allow the top and bottom gates of the left-most planar double gate transistor to be electrically connected to each other. The top gate contact shapes 1724 and bottom gate contact shapes 1726 allow the top gate and bottom gate, within each of the other three planar double gate transistors in FIG. 17, to be at different voltages during operation.

Figure 18:
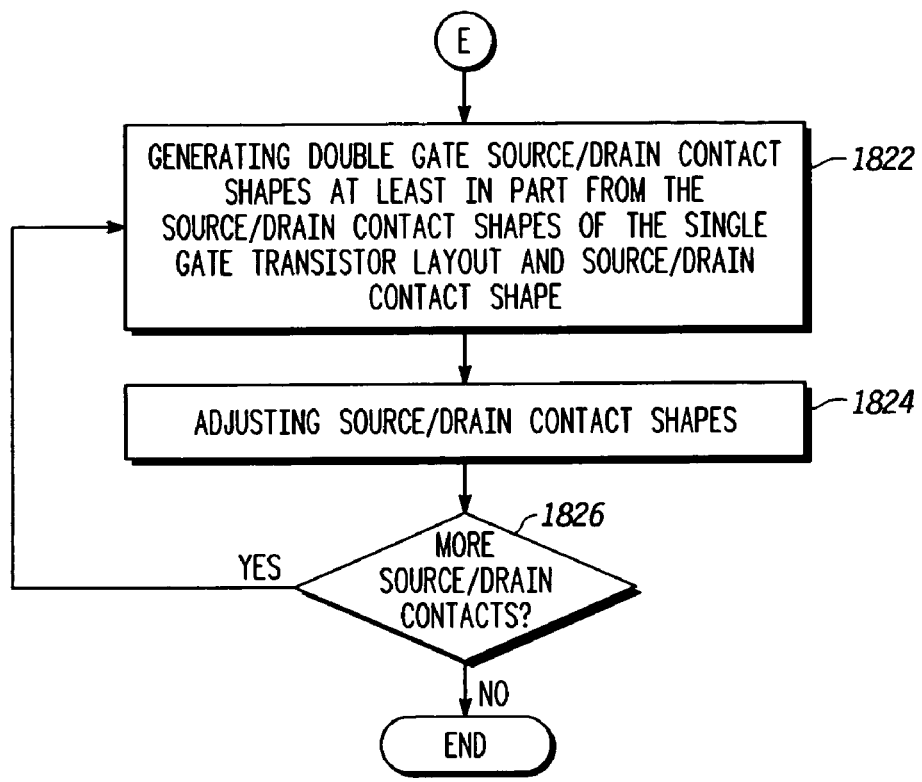
FIG. 18 includes a flow diagram for generating source/drain contact shapes for the planar double gate transistor shapes.
Figure 19:
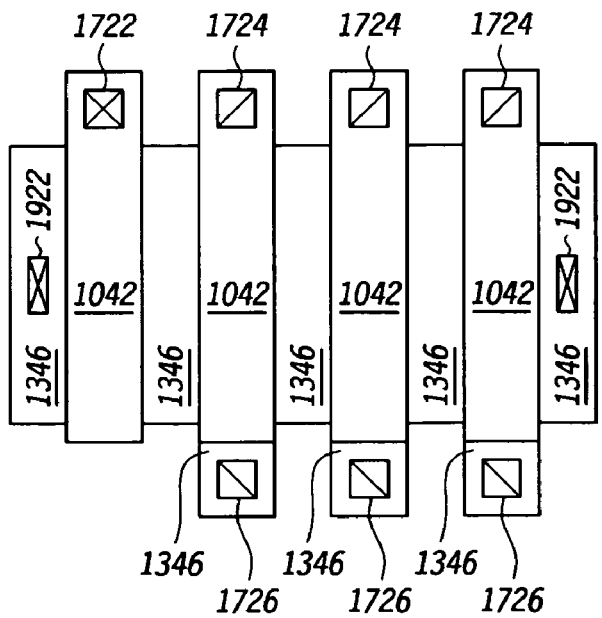
FIG. 19 includes an illustration of source/drain contact shapes in relationship to top and bottom gate shapes and source/drain cavity shapes.

Referring to FIG. 18, the method can include generating S/D contact shapes of the planar double gate transistor layout at least in part from the S/D contact shapes of the single gate transistor layout and the S/D cavity shape 1449 (block 1822). At least some of the S/D contact shapes 1922 in FIG. 19 can be generated at least in part from S/D contact shapes of the single gate transistor. In one embodiment, additional S/D contact shapes 1922 may be generated between serially connected planar double gate transistors, as illustrated in FIG. 19. Although one S/D contact shape 1922 is illustrated adjacent to each side of the planar double gate transistors, more than one S/D contact shape 1922 can be located adjacent to each side of planar double gate transistors. In another embodiment (not illustrated), more than one S/D contact shape 1922 can be used per side. For example, one or more S/D contact shapes could be places between any two of the top gate shapes 1042.

The method can also include adjusting the S/D contact shapes (block 1824) using any one or more of the adjusting operations previously described. The adjustments may be performed in order to better meet one or more of the design specifications, one or more of the design constraints, or any combination thereof. A determination can be made whether there is another S/D contact shape to be generated (diamond 1826). If "yes," the method is iterated until all S/D contact shapes have been generated. If there are no more S/D contact shapes, the S/D contact shapes can be stored in memory.

Additional layout layers can be automatically generated. The additional layout layers can include one or more contact layout layers, interconnect layout layers, one or more via layout layers, one or more pad layout layers, one or more implant layers, one or more gate layers. The shapes for each of the additional layout layers can be generated from corresponding shapes from the single gate transistor layout. The shapes within the planar double gate transistor layout may need to be moved, adjusted, or otherwise modified to provide the proper specifications or electrical connections for the integrated circuit. After reading this specification, skilled artisans will be able to determine the actions an automated system will perform to generate the proper shapes needed or desired for the integrated circuit.

After reading this specification, skilled artisans will appreciate that the actions described with respect to the method can be performed in a different order than illustrated in the figures. For example, the planar double gate active shape 1144 (FIG. 11) may be generated before the top gate shapes 1042 (FIG. 10). After reading this specification, skilled artisans will also appreciate that some shapes for the planar double gate transistor shapes may or may not be generated from corresponding shapes in single gate transistor shapes. For example, some of the S/D cavity shapes 1922 (FIG. 19) in the planar double gate transistor shapes may be generated at least in part from S/D contact shapes in the single gate transistor shapes, whereas other S/D cavity shapes 1922 in the planar double gate transistor shapes may be generated without using any of the S/D contact shapes in the single gate transistor shapes.

Figure 20:
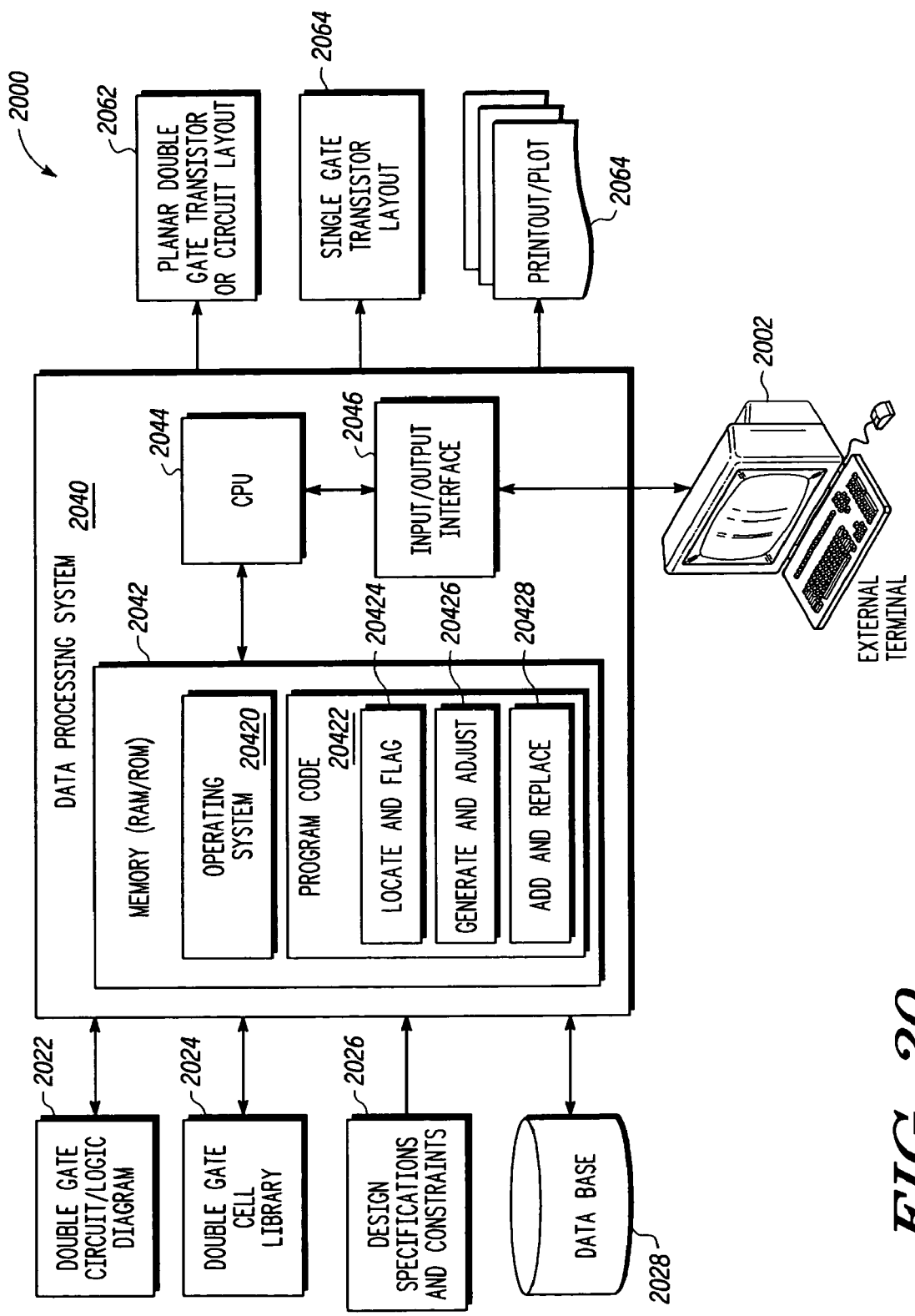
FIG. 20 includes an illustration of a system for automatically generating planar double gate transistor shapes and planar double gate circuit and logic diagram from an input that includes double gate transistor shapes double gate transistor circuit/logic diagram, or any combination thereof.

FIG. 20 includes an exemplary system 2000 that can be used to automatically generate the planar double gate transistor shapes. The system 2000 includes a data processing system 2040, which in one embodiment can be a standalone computer, a server computer, a distributed computing system, or the like. The data processing system includes at least one central processing unit ("CPU") 2044 that is bi-directionally coupled to memory 2042 and an input/output interface 2046.

The memory 2042 can include random access memory ("RAM"), read only memory ("ROM"), flash memory, tape drive memory, a hard disk, other suitable memory, or any combination thereof. The memory 2042 can include media that can be read by the CPU 2044. Therefore, the memory includes a data processing system readable medium. The memory 2042 can include an operating system 20420 and program code 20422 used to perform operations to generate the planar double gate transistors shapes. The program code 20422 can include a locate and flag module 20424, a generate and adjust module 20426, and an add and replace module 20428. After reading the program code, the CPU 2044 can execute instructions within the program code to carry out the methods described herein. In one embodiment, the instructions may be lines of assembly code, Fortran code, Computer-Assisted Design ("CAD") script code, compiled C++, Java, or other language code.

A terminal 2002 is provided to allow a user to interact with the data processing system 2040. In one embodiment, the terminal 2002 is a monitor with a keyboard and mouse, a workstation, a desktop or laptop computer, or other suitable device to allow a user to provide input to the data processing system 2040 and potentially to receive output from the data processing system 2040.

A user at the terminal 2002 can instruct the data processing system 2040 to read or otherwise access one or more files or other data within a double gate circuit/logic diagram 2022, a double gate cell library 2024, design specifications and constraints 2026, a database 2028, other suitable input, or any combination thereof The data processing system 2040 can perform the methods described herein to automatically generate a planar double gate transistor circuit layout 2062, a single gate transistor layout 2064, a printout/plot 2066, other suitable output, or any combination thereof.

Note that many other embodiments can be used to perform the methods described herein. Therefore, the system 2000 is an exemplary, non-limiting embodiment. After reading this specification, skilled artisans will be able to configure other systems that can perform the methods described herein, where such other systems can be tailored to the needs or desires of an entity operating any of such other systems.

Figure 21:
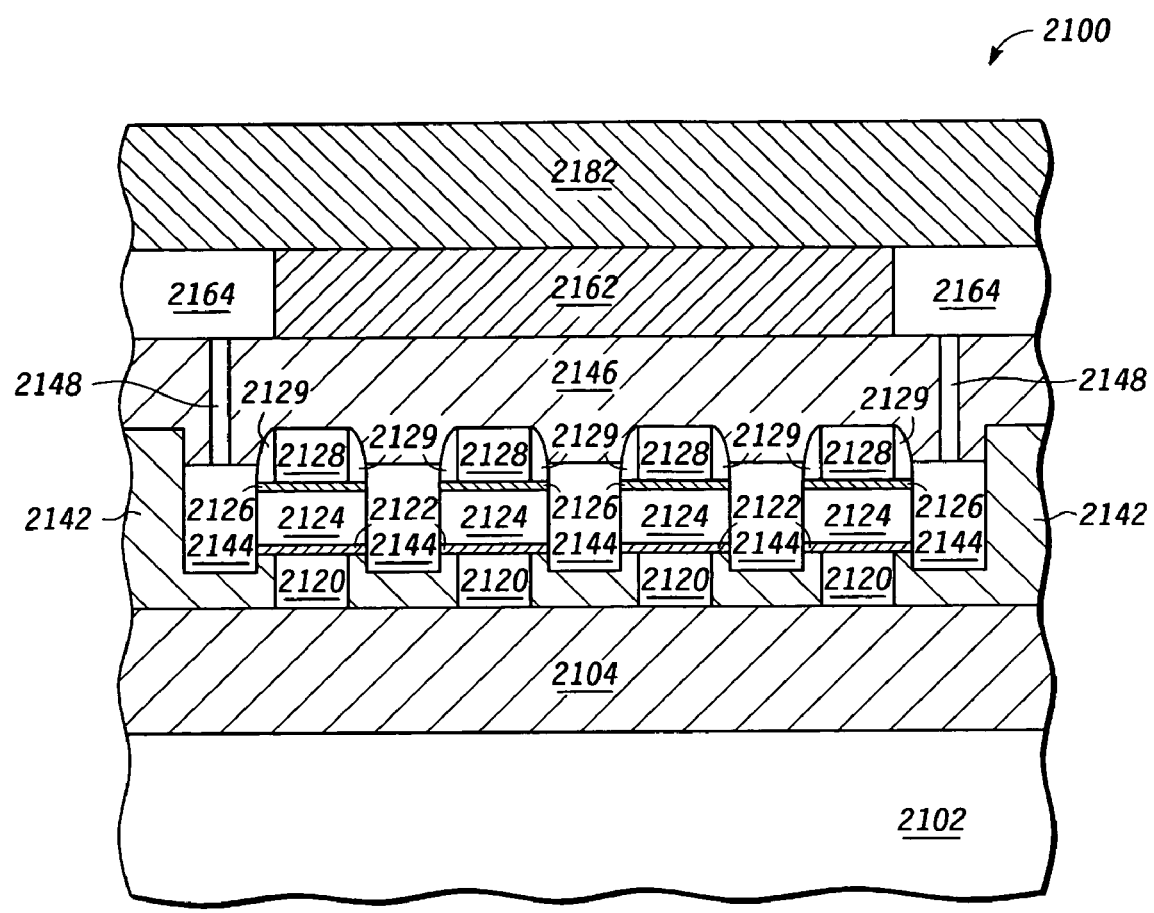
FIG. 21 includes an illustration of a cross-section view of a portion of an electronic device that includes four serially-connected, planar double gate transistors that can be generated using masks having the shapes as described herein.

The information generated by the data processing system 2040 can be used to generate a mask set that can be used to form an integrated circuit 2100, as illustrated by the structure as seen from a cross-sectional view in FIG. 21. The integrated circuit 2100 illustrates the relationships of some of the features formed within the circuit 300 of FIG. 3 using the shapes that were automatically generated using the data processing system 2040. In one embodiment, the integrated circuit 2100 includes a base material 2102 (e.g., a silicon wafer or other suitable material), and an insulating layer 2104. Bottom gate electrodes 2120, bottom gate dielectric layer 2122, active regions 2124, top gate dielectric layer 2126, the top gate electrodes 2128, and sidewall spacers 2129 that overlie portions of the active regions 2124, as illustrated in FIG. 21. Another insulating layer 2142 lies adjacent to the bottom gate electrodes and outside the circuit within the electronic device 2100.

S/D regions 2144 lie between the active regions 2124. Another insulating layer 2146 overlies the top gate electrodes 2128, the S/D regions 2144, and the insulating layer 2142. Contact plugs 2148 extend through the insulating layer 2146 to at least some of the S/D regions 2144. Although not illustrated in FIG. 21, contact plugs contact the top gate electrodes 2128, the bottom gate electrodes 2120, or combinations of top and bottom gate electrodes 2128 and 2120. Still another insulating layer 2162 and interconnects 2164 overlie the insulating layer 2146 and contact plugs 2148, respectively. Other interconnects (not illustrated) are connected to contact plugs (not illustrated) for the top gate electrodes 2128 and bottom gate electrodes 2120.

Additional insulating and interconnection layers can be used. A passivation layer 2182 overlies the uppermost interconnects including pads. Openings (not illustrated) through the passivation layer 2182 can expose pads used to make external power, data, or other signal connections external to the integrated circuit 2100.

Modifications to the above-described method can be used. For example, a cell library can be generated using the techniques as described above. As new layouts corresponding to one or more portions of double gate transistor circuits, logic diagrams, or any combination thereof are generated, such new layouts can be save in the library for future use. In another embodiment, the corresponding single gate transistor circuit, layout or any combination thereof can be saved or output. Gate contact indicators and voltage or signal information corresponding to bottom gates (for double gate transistors) can be retained, too.

The methods and systems described herein are flexible and can be used in conjunction with a circuit cell library, a logic cell library, or any combination thereof. For example, the planar double gate transistor layout may be generated because it does not currently exist within the circuit cell library, the logic cell library, or any combination thereof. Referring to FIG. 6, blocks 622 through 646 may be performed using any one or more of the techniques previously described. Note that the data referred to within block 622 may only have the double gate circuit schematic, logic diagram, or any combination thereof. The method can further include generating at least a file to be stored in the planar double gate transistor circuit library, logic cell library, or any combination thereof. Such a file may be generated and stored using the system 2000 in FIG. 20.

In another embodiment, a single gate transistor circuit library may include an existing single gate transistor cell that corresponds to a desired double gate transistor circuit schematic, logic diagram, or any combination thereof. Referring to FIG. 6, blocks 622 through 646 can be performed using any one or more of the techniques previously described. In this particular embodiment, accessing the data referred to in block 622 can include loading, into the system 2000 in FIG. 20, one or more files for a circuit cell from the single gate transistor circuit library. After the action in block 646, the method can further include generating at least a file that includes the planar double gate transistor circuit library, logic cell library, or any combination thereof. Such a file may be an output from the system 2000 in FIG. 20.

In a further embodiment, a single gate logic circuit library may include an existing single gate logic cell that corresponds to a desired double gate transistor circuit schematic, logic diagram, or any combination thereof. Referring to FIG. 6, blocks 622 and 624 can be performed. In this particular embodiment, accessing the data referred to in block 622 can include loading, into the system 2000 in FIG. 20, one or more files for a logic cell from the single gate transistor logic library. A determination can be made whether there is a double gate transistor circuit library. If yes, the method can include loading the double gate transistor circuit cell library, and generating at least one file that includes the planar double gate transistor logic cell library, based on the single gate logic library. If the double gate transistor circuit library does not exist or does not have a corresponding double gate transistor circuit cell, the process can include loading into a data process system, one or more files from a single gate transistor circuit library, and generating a layout of planar double gate transistor circuit from a layout of a single gate transistor circuit. The method can further include generating at least one file that includes the planar double gate transistor logic cell library, based on the single gate logic library.

The methods described above can be used to automatically generate a planar double gate transistor layout from nearly any representation of double gate transistor circuit schematics, logic diagrams, or any combination thereof. The use of planar double gate transistors will increase as device performance and semiconductor-on-insulating devices become more prevalent. The methods can more quickly, efficiently, and accurately generate a planar double gate transistor layout compared to conventional methods. The shorter cycle time can be achieved by generating the layout more quickly, and also, by avoiding error caused by manual generation of a planar double gate transistor layout. Therefore, generating a planar double gate transistor layout from nearly any representation of double gate transistors is commercially feasible.

Many different aspects and embodiments are possible. Some of such aspects and embodiments are described below. After reading this specification, skilled artisans will appreciate that such aspects and embodiments do not limit the scope of the invention.

In a first aspect, a method of generating a planar double gate transistor layout can include generating a single gate transistor layout at least in part from a first double gate transistor and generating the planar double gate transistor layout at least in part from the single gate transistor layout, wherein the planar double gate transistor layout includes a first gate shape and a second gate shape.

In one embodiment of the first aspect, the method further includes generating a first single gate transistor in a first data processing system readable representation of at least a portion of an electronic device least in part from the first double gate transistor in a second data processing system readable representation of at least a portion of an electronic device. In another embodiment, the method further includes adjusting the first gate shape, the second gate shape, or both for the planar double gate transistor layout. In a particular embodiment, adjusting the first gate shape, the second gate shape, or both is performed in response to a second gate contact indicator.

In still another embodiment of the first aspect, the method further includes generating a first gate contact shape for the planar double gate transistor layout and generating a second gate contact shape for the planar double gate transistor layout.

In a particular embodiment, generating the first gate contact shape, generating the second gate contact shape, or both is performed in response to a second gate contact indicator.

In a further embodiment of the first aspect, generating the single gate transistor layout includes generating a second single gate transistor shape at least in part from a second double gate transistor. The first double gate transistor has a first gate and a second gate that are not electrically connected to each other, and the second double gate transistor has a first gate and a second gate electrically connected to each other. Generating the planar double gate transistor layout includes generating a second planar double gate transistor shape at least in part from the second single gate transistor shape, wherein the second planar double gate transistor shape includes a first gate shape and a second gate shape.

In a particular embodiment, the method further includes generating a second single gate transistor in the first data processing system readable representation at least in part from the second double gate transistor in a second data processing system readable representation of at least a portion of an electronic device. In another particular embodiment, the method further includes adjusting the first gate shape, the second gate shape, or both for the second planar double gate transistor shape. In yet another particular embodiment, the method further includes generating a first gate contact shape to the first gate shape of the second planar double gate transistor layout.

In a more particular embodiment, the first gate contact shape includes a thru-gate contact shape. In another more particular embodiment, the method further includes replacing the first gate contact shape with a thru-gate contact shape. In an even more particular embodiment, the method replacing the first gate contact shape is performed in response to a second gate contact indicator.

In a further embodiment of the first aspect, the method generating the single gate transistor layout further includes generating a first single gate transistor and a second single gate transistor in the first data processing system readable representation at least in part from the first double gate transistor and the second double gate transistor, respectively, in a second data processing system readable representation of at least a portion of an electronic device. The method still further includes generating the first single gate transistor shape and the second single gate transistor shape at least in part from the first single gate transistor and the second single gate transistor, respectively. In another embodiment, the method can further include fabricating the electronic device at least in part using the first planar double gate transistor shape.

In a second aspect, a method of generating a planar double gate transistor shape can include generating a first single gate transistor and a second single gate transistor in a first data processing system readable representation of at least a portion of an electronic device at least in part from a first double gate transistor and a second double gate transistor, respectively, in a second data processing system readable representation of at least a portion of an electronic device. The first double gate transistor can have a first gate and a second gate that are not electrically connected together, and the second double gate transistor can have a first gate and a second gate electrically connected to each other. The method can also include generating a first single gate transistor layout including a first single gate transistor shape and a second single gate transistor shape at least in part from the first single gate transistor and the second single gate transistor, respectively, and generating first gate contact shapes to the first single gate transistor shape and the second single gate transistor shape within the single gate transistor layout.

The method can further include generating a planar double gate transistor layout including a first planar double gate transistor shape and a second planar double gate transistor shape at least in part from the single gate transistor layout, wherein each of the first planar double gate transistor shape and the second planar double gate transistor shape includes a first gate shape and a second gate shape. The method can still further include adjusting the first gate shape of the first planar double gate transistor shape, the second gate shape of the first planar double gate transistor shape, the first gate shape of the second planar double gate transistor shape, the second gate shape of the second planar double gate transistor shape, or an combination thereof for the planar double gate transistor layout.

In one embodiment of the second aspect, the method further includes generating a second gate contact indicator for the first single gate transistor. Adjusting the first gate shape of the first planar double gate transistor shape, the second gate shape of the first planar double gate transistor shape, the first gate shape of the second planar double gate transistor shape, the second gate shape of the second planar double gate transistor shape, or an combination thereof is performed in response to the second gate contact indicator. In another embodiment, the method of further includes generating a second gate contact indicator associated with the first single gate transistor, and in response to the second gate contact indicator replacing the first gate contact shape with a thru-gate contact shape for the second planar double gate transistor shape of the planar double gate transistor layout, generating a second gate contact shape for second gate shape within the first planar double gate transistor shape of the planar double gate transistor layout, or any combination thereof.

In a third aspect, a data processing system readable medium can have code to generate a planar double gate transistor layout, wherein the code is embodied within the data processing system readable medium. The code can include an instruction to generate a single gate transistor at least in part from a double gate transistor and an instruction to generate the planar double gate transistor layout at least in part from the first single gate transistor, wherein the planar double gate transistor layout includes a first gate shape and a second gate shape.

In one embodiment, the code further includes an instruction to generate a second gate contact indicator associated with the single gate transistor and an instruction to adjust the first gate shape, the second gate shape, or both for the planar double gate transistor layout in response to the second gate contact indicator. In yet another embodiment, the code further includes an instruction to generate a first second gate contact indicator associated with the single gate transistor, an instruction to generate a first gate contact shape to the single gate transistor shape within the single gate transistor layout or a first gate contact shape to the planar double gate transistor shape within the planar double gate transistor layout. The code also includes an instruction to be executed in response to the second gate contact indicator, wherein the instruction includes an instruction to replace the first gate contact shape with a thru-gate contact shape for the planar double gate transistor shape of the planar double gate transistor layout, an instruction to generate a second gate contact shape for second gate shape within the planar double gate transistor shape of the planar double gate transistor layout, or an instruction to perform any combination thereof.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, principles of the invention have been described above in connection with specific embodiments. However, one of ordinary skill in the art appreciates that one or more modifications or one or more other changes can be made to any one or more of the embodiments without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. A method of generating a layout of an electronic device comprising:
    generating a first single gate transistor shape at least in part from a double gate transistor circuit schematic, logic diagram, or any combination thereof;
    generating the layout including a first planar double gate transistor shape at least in part from the first single gate transistor shape, wherein:
        generating the layout further comprises generating a first gate shape, a second gate shape and an active shape for the first planar double gate transistor shape; and
        generating the layout is performed such that one of the first and second gate shapes underlies the active shape, and the other of the first and second gate shapes overlies the active shape; and
    storing the layout of the electronic device in memory.

2. The method of claim 1, further comprising adjusting the first gate shape, the second gate shape, or any combination thereof 3. The method of claim 2, further comprising generating a gate contact indicator associated with the first single gate transistor shape, wherein adjusting the first gate shape, the second gate shape, or both is performed in response to the gate contact indicator.

4. The method of claim 1, wherein generating the layout further comprises:
    generating a first gate contact shape associated with the first gate shape; and
    generating a second gate contact shape associated with the second gate shape.

5. The method of claim 4, further comprising generating a gate contact indicator associated with the first single gate transistor shape, wherein generating the first gate contact shape, generating the second gate contact shape, or both is performed in response to the gate contact indicator.

6. The method of claim 1, further comprises generating a second single gate transistor shape at least in part from the double gate transistor circuit schematic, logic diagram, or any combination thereof wherein generating the layout further comprises generating a second planar double gate transistor shape at least in part from the second single gate transistor shape.

7. The method of claim 6, wherein generating the layout further comprises generating a first gate shape and a second gate shape for the second planar double gate transistor shape, wherein:
    the first planar double gate transistor shape has a first gate shape and a second gate shape that are not to be electrically connected to each other; and
    the second planar double gate transistor shape has a first gate shape and a second gate shape that are to be electrically connected to each other.

8. The method of claim 7, wherein generating the layout further comprises adjusting the first gate shape, the second gate shape, or both for the second planar double gate transistor shape.

9. The method of claim 6, wherein generating the layout further comprises generating a first gate contact shape associated with the first gate shape of the second planar double gate transistor shape.

10. The method of claim 9, wherein generating the layout further comprises replacing the first gate contact shape of the second planar double gate transistor shape with a thru-gate contact shape associated with the first and second gate shapes of the second planar double gate transistor.

11. The method of claim 10, wherein a separate gate contact shape is not generated for the second gate shape of the second planar double gate transistor shape.

12. The method of claim 10, wherein generating the layout further comprises:
    generating a first gate contact shape to the first gate shape of the first planar double gate transistor shape; and
    generating a second gate contact shape to the second gate shape of the first planar double gate transistor shape.

13. The method of claim 6, further comprising generating the first single gate transistor shape and generating the second single gate transistor shape further comprises:
    generating s circuit schematic including a first single gate transistor and a second single gate transistor at least in part from the double gate transistor circuit schematic, logic diagram, or any combination thereof;
    generating the first single gate transistor shape at least in part from the circuit schematic; and
    generating the second single gate transistor shape at least in part from the circuit schematic.

14. The method of claim 1, further comprising fabricating the electronic device at least in part using the first planar double gate transistor shape.

15. A method of generating a layout for an electronic device comprising:
    generating a circuit schematic including a first single gate transistor and a second single gate transistor at least in part from a double gate transistor circuit schematic, logic diagram, or any combination thereof;
    generating a gate contact indicator associated with the first single gate transistor, the second single gate transistor, or any combination thereof;
    generating a first single gate transistor shape and a second single gate transistor shape at least in part from the circuit schematic;
    generating a layout including a first planar double gate transistor shape and a second planar double gate transistor shape at least in part from the first single gate transistor shape and the second single gate transistor shape, respectively, wherein each of the first planar double gate transistor shape and the second planar double gate transistor shape includes a first gate shape and a second gate shape; and
    adjusting the first gate shape of the first planar double gate transistor shape, the second gate shape of the first planar double gate transistor shape, the first gate shape of the second planar double gate transistor shape, the second gate shape of the second planar double gate transistor shape, or any combination thereof; and storing the first gate shape of the planar double gate transistor shape, the second gate shape of the first planar double gate transistor shape, the first gate shape of the second double gate transistor shape, or any combination thereof in a memory, wherein storing is performed after adjusting the first gate shape of the first planar double gate transistor shape, the second gate shape of the first planar double gate transistor shape, the first gate shape of the second planar double gate transistor shape, the second gate shape of the second planar double gate transistor shape, or any combination thereof.

16. The method of claim 15, wherein adjusting the first gate shape of the first planar double gate transistor shape, the second gate shape of the first planar double gate transistor shape, the first gate shape of the second planar double gate transistor shape, the second gate shape of the second planar double gate transistor shape, or any combination thereof is performed in response to the gate contact indicator.

17. The method of claim 15, wherein generating the layout further comprises:

generating first gate contact shapes for the first gate shapes; and in response to the gate contact indicator:
replacing the first gate contact shape of the second planar double gate transistor shape with a thin-gate contact shape;
generating a second gate contact shape associated with second gate shape of the first planar double gate transistor shape; or
any combination thereof.

18. A memory having code stored therein, wherein a processor is operable to execute the code the code comprising:

an instruction to generate a single gate transistor shape at least in part from a double gate transistor circuit schematic, logic diagram, or any combination thereof;

an instruction to generate the layout including a planar double gate transistor shape at least in pail from the single gate transistor shape;

an instruction to generate a gate contact indicator associated with the single gate transistor; and an instruction to adjust a first gate shape. a second gate shape, or any combination thereof of the planar double gate transistor layout in response to the gate contact indicator.

19. The memory of claim 18, wherein:

the an instruction to generate the layout comprises an instruction to generate a first gate shape and a second gate shape of the planar double gate transistor shape; and the code further comprises:
an instruction to generate a first gate contact indicator associated with the single gate transistor;
an instruction to generate a first gate contact shape associated with the first gate shape; and
an instruction to be executed in response to the gate contact indicator; wherein the instruction includes:
an instruction to replace the first gate contact shape with a thin-gate contact shape associated with the first and second gate shapes; or
an instruction to generate a second gate contact shape associated with second gate shape.

* * * * *

UNITED STATES PATENT AND TRADEMARK OFFICE
CERTIFICATE OF CORRECTION

PATENT NO. : 7,530,037 B2
APPLICATION NO. : 11/258777
DATED : May 5, 2009
INVENTOR(S) : Thuy B. Dao It is certified that error appears in the above-identified patent and that said Letters Patent is hereby corrected as shown below:

Column 19, Line 27, Please change "thin-gate" to --thru-gate-- as shown in the originally filed specification.

Column 20, Line 7, Please change "pail" to --part-- as shown in the originally filed specification.

Column 20, Line 25, Please change "indicator;" to --indicator,-- as shown in the originally filed specification.

Column 20, Line 27, Please change "thin-gate" to --thru-gate-- as shown in the originally filed specification.

Signed and Sealed this

Eighteenth Day of May, 2010

David J. Kappos
*Director of the United States Patent and Trademark Office*